United States Patent [19]

Gerzberg et al.

[11] 4,233,671
[45] Nov. 11, 1980

[54] READ ONLY MEMORY AND INTEGRATED CIRCUIT AND METHOD OF PROGRAMMING BY LASER MEANS

[75] Inventors: Levy Gerzberg; Arnon Gat, both of Palo Alto; Roger Melen, Los Altos Hills; James F. Gibbons, Palo Alto, all of Calif.

[73] Assignee: Stanford University, Stanford, Calif.

[21] Appl. No.: 1,360

[22] Filed: Jan. 5, 1979

[51] Int. Cl.² .............................................. G11C 17/06
[52] U.S. Cl. .................................... 365/105; 365/115; 307/317 R
[58] Field of Search ................. 365/94, 105, 114, 115; 307/317 R, 238

[56] References Cited

U.S. PATENT DOCUMENTS

| | | | |
|---|---|---|---|
| 3,763,476 | 10/1973 | Wilson et al. | 365/115 |
| 3,860,915 | 1/1975 | Geier et al. | 365/115 |
| 4,130,891 | 12/1978 | Kirkpatrick et al. | 365/105 |

*Primary Examiner*—Terrell W. Fears
*Attorney, Agent, or Firm*—Flehr, Hohbach, Test, Albritton & Herbert Test

[57] ABSTRACT

A programmable read only memory (PROM) includes a first plurality of conductive lines, a second plurality of conductive lines and polycrystalline silicon material therebetween. At the crossing points of the first and second plurality of lines doped regions are provided in the polycrystalline silicon in contact with a second line and which extend at least partially through the material. To provide a diode interconnect at any crossing point, the associated region is irradiated by a laser beam to either cause diffusion of dopant atoms to the underlaying conductive line or activate implanted ions, thereby electrically interconnecting the first and second lines through a diode. The PROM is readily fabricated as part of a monolithic integrated circuit or electrical array and can be programmed after completion of the fabrication process.

25 Claims, 14 Drawing Figures

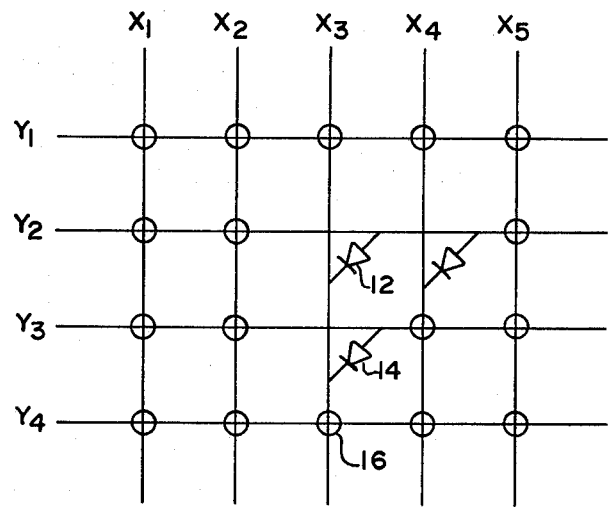
FIG.—1
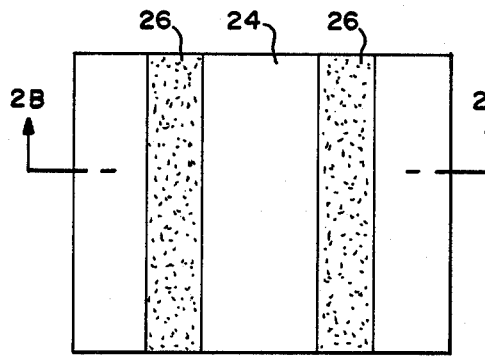
FIG.—2A
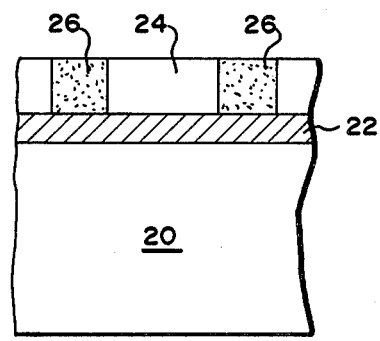
FIG.—2B
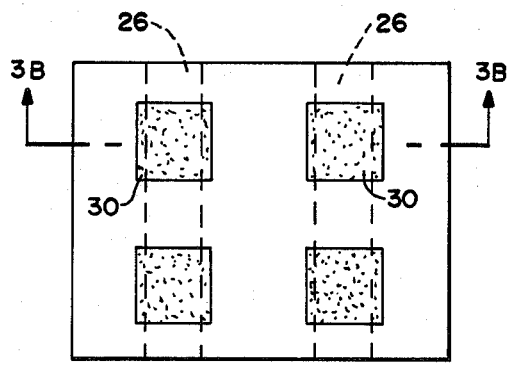
FIG.—3A
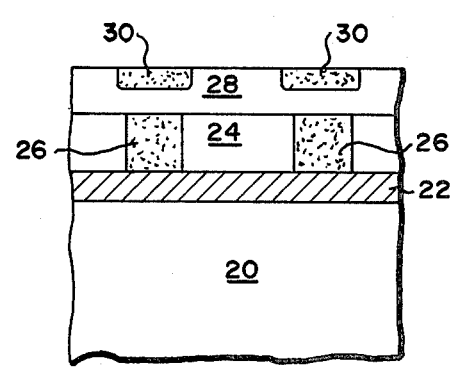
FIG.—3B

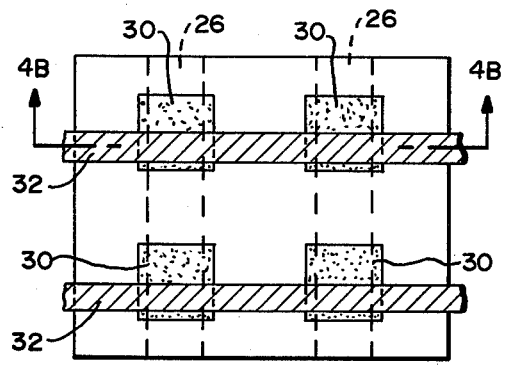
FIG.—4A
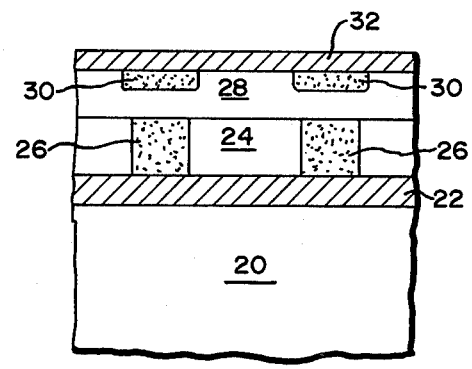
FIG.—4B
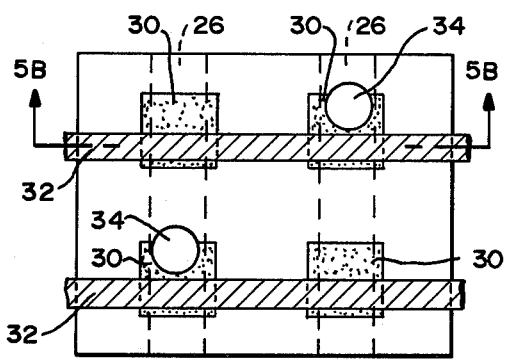
FIG.—5A
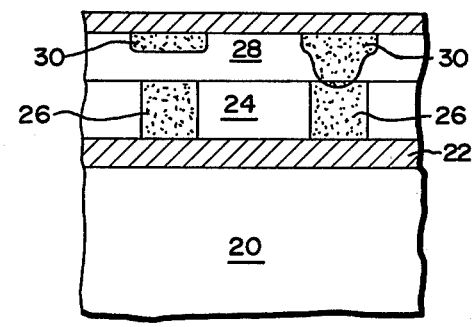
FIG.—5B
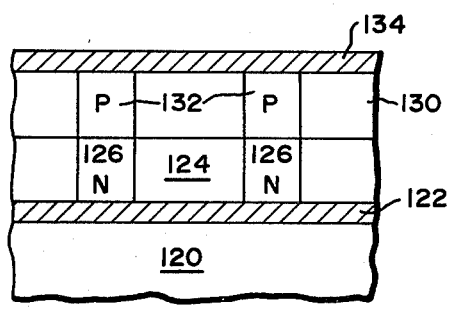
FIG.—6
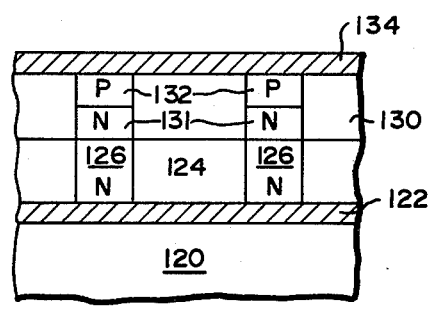
FIG.—7

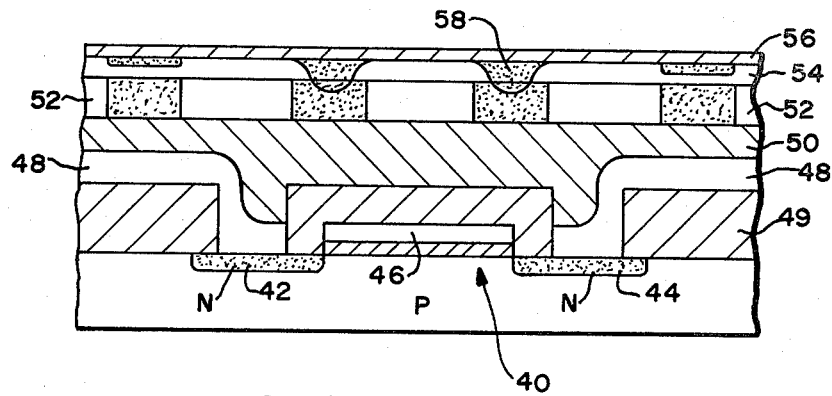
FIG.—8
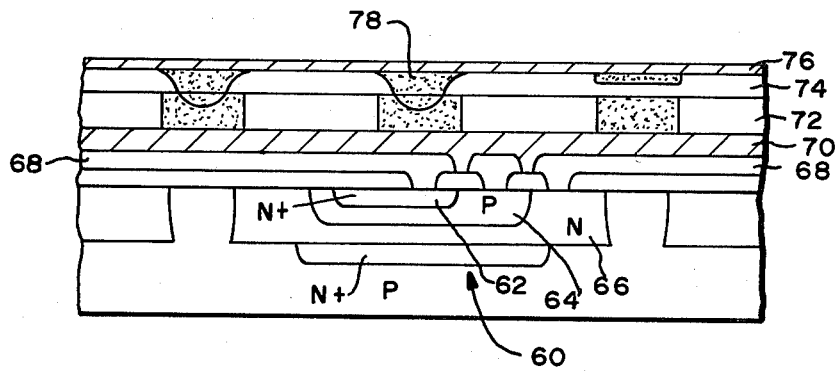
FIG.—9
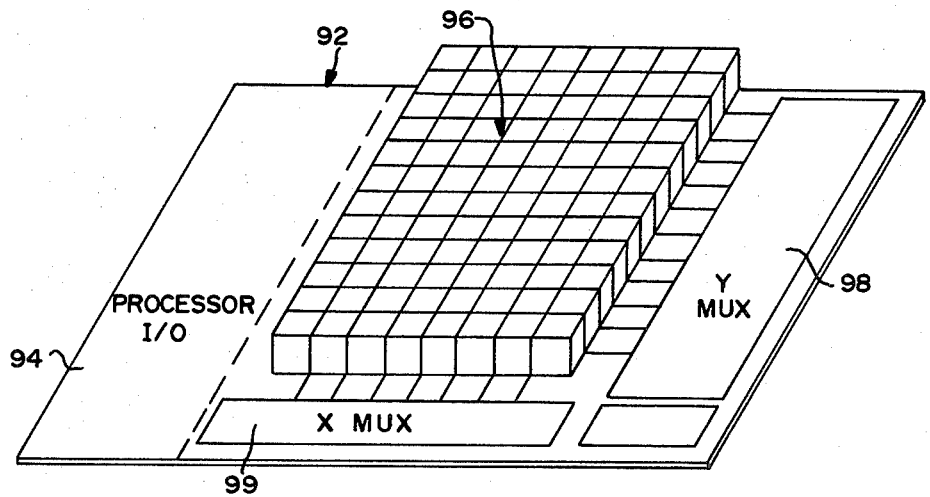
FIG.—10

READ ONLY MEMORY AND INTEGRATED CIRCUIT AND METHOD OF PROGRAMMING BY LASER MEANS

This invention relates generally to semiconductor devices and integrated circuits, and more particularly the invention relates to programmable read only memories and the method of programming a read only memory.

A read only memory (ROM) comprises a plurality of X lines and a plurality of Y lines which are selectively addressed to read stored bits of information. In one embodiment of a ROM, the X lines and Y lines are selectively interconnected by diodes to define stored bits of information. By addressing the X and Y lines the stored information, defined by a current path between the addressed lines (e.g. a "1") or lack thereof (e.g. a "zero"), can be detected. Semiconductor ROM's are known which can be programmed after fabrication by the application of high voltages to render selected transistor components conductive.

Laser coding has been proposed, also. North and Weick in "Laser Coding of Bipolar Read Only Memories" IEEE Journal of Solid State Circuits, Vol. SC-11, No. 4, August, 1976, pp. 500–505 propose the coding of high speed bipolar silicon integrated circuit memories by the selective vaporization of metal links connecting contact pads of each memory cell to metal bit lines. By vaporizing the conductive link, current paths are interrupted to define the stored code.

Kuhn, et al in "Experimental Study of Laser Formed Connections for LSI Wafer Personalization, " IEEE Journal of Solid State Physics, Vol. SC-10, No. 4, August 1975, pp. 219–228 propose the selective forming of contacts by vaporizing and melting material through use of a laser. As described, an aluminum conductor is placed over a contact region of an underlying semiconductor substrate with a thin layer of silicon oxide therebetween. In forming a connection between the aluminum and the contact region, a laser beam is applied to open the aluminum layer with material being removed by vaporization. Then the silicon oxide insulating layer is removed by controlled microexplosion caused by thermal stress and/or vaporization of material at the silicon oxide-silicon interface. Finally, a conducting path is formed by flow of molten silicon into contact with the aluminum.

These and similar laser processes require considerable laser power and the consequent melting and vaporizing of material can result in damaged devices, thus reducing product yield. In addition, large areas are required. Accordingly, no commercial use of these processes are known.

An object of the present invention is an improved programmable read only memory.

Another object of the invention is an improved method of programming a read only memory by selective radiation.

Still another object of the invention is a programmable read only memory which is readily fabricated as part of an integrated circuit or on top thereof.

Yet another object of the invention is an integrated circuit including read only memory which is readily programmed after fabrication.

Briefly, a programmable read only memory in accordance with the present invention includes a first plurality of spaced parallel conductive lines on a surface of a support means and a layer of polycrystalline semiconductor material overlaying said first plurality of conductive lines includes doped regions extending partially through the layer with each region being positioned above a line of the first plurality of conductive lines. A second plurality of conductive lines is provided on the surface of the layer of polycrystalline semiconductor material with the second plurality of conductive lines being skewed with respect to the first plurality of conductive lines. The regions of doped material are provided at cross points of the first plurality of lines and the second plurality of conductive lines, and the first plurality of lines and second plurality of lines are selectively interconnected by applying a radiation beam to selected ones of the doped regions to diffuse dopant atoms to the conductive line thereunder and thus provide diode current paths between the first plurality of lines and second plurality of lines. Advantageously, no vaporizing of material results therefrom. Further, the read only memory can be fabricated on the surface of an integrated circuit and interconnected therewith to become a part thereof. Additional memory layers can be added resulting in a compact multilayer structure.

In coding the read only memory, a radiation beam such as a laser or electron beam is directed on a doped region with sufficient energy to cause local diffusion, with or without melting, of dopants to the underlying line and thereby interconnect the first line to the second line, but without physically damaging the structure.

In an alternative embodiment, the doped regions can be formed by ion implantation with the doped regions extending substantially to the underlying conductive lines. Thereafter, by application of a radiation beam selected implanted regions are activated to form diodes connected between X and Y lines.

The invention and objects and features thereof will be more readily understood from the following detailed description and appended claims when taken with the drawing.

FIG. 1 is a schematic illustrating a read only memory.

FIG. 2 through FIG. 5 illustrate in plan view and section view one embodiment of fabrication and programming of a read only memory in accordance with the present invention.

FIGS. 6 and 7 are section views of alternative embodiments of the invention.

FIG. 8 is a section view of a portion of an integrated circuit including a read only memory and a silicon gate field effect transistor in accordance with the present invention.

FIG. 9 is a section view of a portion of an integrated circuit including a read only memory and a bipolar junction transistor in accordance with the present invention.

FIG. 10 is a perspective view of a microprocessor system including a programmable read only memory in accordance with the present invention.

Referring now to the drawings, FIG. 1 illustrates schematically a read only memory which includes a plurality of first conductive lines, designated the X lines (X1–X5), and a second plurality of conductive lines designated the Y lines (Y1–Y4). Typically, the first plurality of lines is skewed with respect to the second plurality of lines with the intersection of lines either being interconnected through diodes as shown or not connected as illustrated by circles. The memory is read by applying a voltage potential between an X line and a Y line and detecting the presence or absence of a current. When no connection is made between the lines, the absence of a current may signify a binary "0." Conversely, when a connection is made between the two lines the presence of a current may signify a binary "1." For example, by applying a negative voltage to the X3 line and grounding the Y2 line, a current flowing from the Y2 line through diode 12 to the X3 line is detected. Similarly, by applying the negative voltage to the X3 line and grounding the Y3 line a current flowing from the Y3 line through diode 14 to the X3 line can be detected. However, with the negative voltage on the X3 line and the Y4 line grounded no current flows due to no connection being made between the Y4 and X3 lines, as designated by circle 16. Thus, by addressing the memory array through energization of selected X lines and Y lines, stored data or binary bits can be read out by detecting the presence or absence of a current. It will be appreciated that the array can include thousands of lines and thousands of bits of stored data.

It is advantageous to fabricate a memory array and retain the capability of programming the memory after completion of the array. Moreover, it would be advantageous to incorporate such a read only memory in a monolithic integrated circuit or other microminiature electrical system. Conventional read only memories typically do not include other circuitry and most are preprogrammed during fabrication. However, a read only memory in accordance with the present invention is readily fabricated at part of an integrated circuit or other electronic array and may be programmed after fabrication.

Referring now to FIG. 2(A & B) through FIG. 5(A & B) the fabrication and programming of a read only memory in accordance with the present invention is illustrated in one embodiment. In each of the figures the plan view of a portion of a ROM is illustrated in FIG. A, and a section view of the portion of the ROM shown in FIG. A is illustrated in FIG. B.

In FIGS. 2A and 2B a semiconductor substrate 20 of silicon, for example, is provided with a silicon oxide layer 22 on a major surface thereof, and a layer of polycrystalline silicon 24 is formed on the surface of silicon oxide layer 22. Substrate 20 may comprise a part of an integrated circuit, or the substrate may be of other suitable material such as polycrystalline silicon or glass which has been deposited on a circuit array or the like to accommodate the read only memory. Silicon oxide layer 22 may be typically on the order of 1000 angstroms in thickness to provide electrical insulation and also a suitable surface for the vapor deposition of polycrystalline silicon or like material. The polycrystalline silicon material 24 may be formed by vapor deposition in a suitable reactor to a thickness on the order of 0.5 micron, and a plurality of spaced parallel conductive lines 26 are formed therein by diffusion or ion implantation techniques. For N type conductivity, arsenic may be implanted with a concentration of $5 \times 10^{15}$ ions per square centimeter at a potential 170 kev, for example. The doped polycrystalline silicon is preferably annealed either in an oven at an elevated temperature (e.g. 1100° C. for 30 minutes) or by radiation scanning as disclosed in copending application Ser. No. 950,828, filed Oct. 12, 1978 for, METHOD OF FORMING POLYCRYSTALLINE SEMICONDUCTOR INTERCONNECTIONS, RESISTORS & CONTACTS & RESULTING STRUCTURE. The undoped polycrystalline silicon is non-conducting thereby providing electrical isolation between lines.

Thereafter, as illustrated in FIG. 3A and FIG. 3B a second layer of polycrystalline silicon material 28 is formed on the first layer 24 by vapor deposition with the thickness of layer 28 being on the order of 0.5 micron. A plurality of rectanularly shaped, P type doped regions 30 are formed in surface regions of layer 28, for example, by implanting boron ions in a density of $5 \times 10^{14}$ ions per square centimeter at 100 kev. The shallow regions 30 do not extend completely through layer 28 and thus are spaced from the underlying conductive line 26.

As seen in FIG. 3A, each of the regions 30 is generally rectangular in shape and is positioned above a conductive line 26 in the underlying polycrystalline layer.

In FIG. 4 a second plurality of conductive lines 32 are formed on the surface of layer 28 in alignment with the diffused regions 30 and skewed with respect to the underlying plurality of lines 26. Lines 32 may be formed by sputtering or vapor deposition and selective etching of suitable metal such as aluminum, or alternatively the lines may be formed by doping of the surface of polycrystalline silicon layer 28. Importantly, it will be noted that the width of lines 32 are substantially less than the length of the rectangular regions 30. The read only memory is structurally completed at this state, and programming thereof can be accomplished at a later time in accordance with the user's needs.

Referring to FIG. 5 the programming of the read only memory is accomplished by applying a laser beam on a generally circular surface area 34 which overlaps a region 30 but preferably is spaced from the metal lead 32. By melting the region 30 of the polycrystalline layer 28, the P type ions diffuse through layer 28 and into contact with the underlying N type region of layer 24 which defines line 26. Thus, a PN junction, or diode, is formed which interconnects metal layer 32 to the underlying line 26. Thus, the first plurality of lines can be selectively interconnected with the second plurality of lines by application of a laser beam and diffusion of the P type impurities in the radiated region 30 to the underlying line.

Advantageously, the radiation beam need not contact the metal lines 32, and no melting of the metal in the lines results. However, the invention can be practiced by applying the laser beam directly to the line 32 to cause diffusion of impurities in the region 30 immediately underlying the laser beam and the metal line. Particularly if the second plurality of lines are defined by doped polycrystalline material, application of the laser beam likely would have no deleterious effects by being applied directly thereto. Closer spacing of the second plurality of lines can then be effected.

It will be appreciated, also, that the memory can be programmed prior to application of the second plurality of lines by radiation aided diffusion of impurities in selected regions 30 prior to the definition of the second plurality of lines. Such a procedure may be preferred if later programming of the ROM is not required.

Rather than use of diffused doped regions for interconnecting the two sets of lines, ion implanted regions can be employed, as illustrated in FIGS. 6 and 7. In FIG. 6, a silicon substrate 120 has a layer 122 of silicon oxide on one surface with a polycrystalline silicon layer 124 formed thereon. The first set of lines 126 are formed in layer 124 and a second polycrystalline silicon layer 130 is formed thereover. Regions 132 are formed by ion implantation with the regions extending substantially through layer 124. Assuming that the lines 126 are N type conductivity, the regions 132 are P type. A second set of lines are formed over layer 130 such as illustrated by a metal line 134 such as tungsten.

As is well known in the art, implanted ions must be activated by annealing. Selective annealing, where a binary "1" is wished to be written, can be done with a radiation beam either through the metal 134 or on the side of the metal line. By annealing the implanted region 132, diode interconnections between line 134 and the lines 126 can be created by activating a P type region 132 which then forms a P-N junction with the underlying N type region 126. Advantageously, the annealing of the implanted region can be done selectively by laser irradiation and at a lower temperature than is required for melting. See, for example, Gat, Gerzberg, Gibbons et al "cw Laser Anneal of Polycrystalline Silicon: Crystalline Structure, Electrical Properties," Applied Physics Letters, Oct. 15, 1978.

FIG. 7 is a cross-section of a portion of a device similar to that illustrated in FIG. 6, but in this embodiment an N type region 131 is implanted in the layer 130 and then the P type region 132 is implanted thereover. Upon activation of the regions 131 and 132 by annealing, the P-N junction of the interconnecting diode is located at the interface of the regions 131, 132.

It will be appreciated that the regions 132 in FIG. 6 and regions 131, 132 in FIG. 7, as well as the regions 30 in FIG. 3, may comprise a continuous, ion-implanted layer. Prior to annealing the layer is substantially nonconductive. Only at the locations of irradiation and ion diffusion or annealing does the layer become conductive.

A programmable read only memory in accordance with the present invention is readily fabricated with an integrated circuit array as illustrated in the section views of FIG. 8 and FIG. 9 of portions of integrated circuits. In FIG. 8 a portion of the ROM is illustrated above a silicon gate field effect transistor shown generally at 40 which includes a source 42, drain 44, and a gate electrode 46. The metal interconnects 48 to the source and drain regions are formed over field oxide 49 and are covered with a silicon oxide layer 50, and the read only memory structure is formed on the insulating silicon oxide layer 50. In a structure similar to that illustrated in FIGS. 2–5, a first plurality of lines are provided in a first polycrystalline silicon layer 52 which is formed directly on silicon oxide layer 50, and the second polycrystalline silicon layer 54 is formed on layer 52 with a second line defined by metal layer 56 on polysilicon 54. Selective interconnection of line 56 to lines in the underlying polycrystalline silicon layer 52 is accomplished by applying a radiation beam to selected regions 58 to diffuse dopants therein into engagement with lines in the first polycrystalline silicon layer 52.

A similar cross section view is illustrated in FIG. 9 of a portion of an integrated circuit which includes a bipolar junction transistor 60 including emitter 62, base 64, and collector 66. Metal leads 68 are provided to the collector and emitter, respectively, and the leads are covered by an insulating layer of silicon oxide 70. The read only memory is formed directly thereover including a first polycrystalline silicon layer 72, a second polycrystalline silicon layer 74, metal layer 76, and the regions 78 which selectively interconnect metal layer 76 to lines in layer 72 by means of application of a laser beam.

A read only memory in accordance with the present invention not only can be incorporated as part of an integrated circuit, the array can be fabricated directly on a circuit assembly as shown in FIG. 10 which illustrates a perspective view of a microprocessor circuit board. The microprocessor is incorporated in a large scale integrated chip which is mounted on a frame 92 along with suitable processor I/O circuitry 94. The microprocessor LSI chip is coated with a suitable insulating material such as glass or epoxy, and a read only memory array 96 is then formed over the LSI chip. The Y lines of the ROM are connected to a Y MUX 98, and the X lines of the ROM are connected to an X MUX 99. Again, programming of the ROM can be effected after completion of the electrical assembly by selectively irradiating the ROM to effect interconnection of selected X and Y lines and thus record binary data.

The invention has been described with reference to several illustrative embodiments, and modifications of the illustrated embodiments have been suggested. For example, the first and second plurality of lines can be fabricated from metal, doped polycrystalline silicon, or other suitable conductive material. While interconnection of the lines is preferably accomplished by applying a radiation beam to a surface area adjacent to the top conductive line and thus avoiding physical alternation of the line, the radiation beam can be applied directly to the line thus allowing higher density assembly of the ROM structure. While a laser beam has been described for effecting the diffusion of dopant impurities, other radiation beams such as an electron beam could be utilized. As indicated, the ROM can be programmed during fabrication and prior to formation of the second plurality of lines if so desired. Further, the ROM may comprise multiple layers of address lines in a stacked array thus providing greater storage capacity in the same surface area.

Thus, while the invention has been described with reference to specific embodiments the description is illustrative of the invention and is not to be construed as limiting the invention. These and other modifications and applications may occur to those skilled in the art without departing from the true spirit and scope of the invention as defined by the appended claims.

What is claimed is:

1. A read only memory comprising support means, a first plurality of spaced parallel conductive lines on a surface of said support means, said first plurality of conductive lines including dopants of a first conductivity type, a layer of polycrystalline semiconductor material overlaying said first plurality of conductor lines, said layer of polycrystalline semiconductor material including regions of doped material extending at least partially through said layer, said doped regions including dopants of opposite conductivity type, each of said regions being positioned above one line of said first plurality of conductive lines, and a second plurality of spaced parallel conductive lines on the surface of said layer of polycrystalline semiconductor material, said second plurality of conductive lines being skewed with respect to said first plurality of conductive lines with said regions of doped material provided at crossing points of said first plurality of lines and said second plurality of lines.

2. A read only memory as defined by claim 1 wherein said regions of doped material extend partially through said layer and wherein said first plurality of lines and said second plurality of lines are selectively interconnected through diodes by applying a radiation beam to selected ones of said doped regions to diffuse dopants therein to the conductive line thereunder and provide current paths between said first plurality of lines and said second plurality of lines.

3. A read only memory as defined by claim 2 wherein said radiation beam is applied to selected ones of said doped regions prior to formation of the second plurality of lines.

4. A read only memory as defined by claim 2 wherein said radiation beam is applied to selected ones of said doped regions after formation of said second plurality of lines.

5. A read only memory as defined by claim 1 wherein said said polycrystalline semiconductive material is silicon.

6. A read only memory as defined by claim 5 wherein said support means includes a monocrystalline silicon substrate and a layer of silicon oxide on a major surface thereof.

7. A read only memory as defined by claim 6 wherein said first plurality of conductive lines comprise doped polycrystalline silicon.

8. A read only memory as defined by claim 7 wherein said doped polycrystalline silicon is formed in a layer of polycrystalline silicon by selective doping and annealing.

9. A read only memory as defined by claim 8 wherein said annealing is provided by selective irradiation.

10. A read only memory as defined by claim 9 wherein said second plurality of lines comprise metal.

11. A read only memory as defined by claim 6 wherein said first plurality of conductive lines comprise metal.

12. A read only memory as defined by claim 6 wherein said monocrystalline silicon substrate includes an integrated circuit.

13. A read only memory as defined by claim 12 wherein said read only memory is electrically interconnected with said integrated circuit.

14. A read only memory as defined by claim 1 wherein said regions of doped material extend substantially through said layer and are formed by ion implantation and wherein said first plurality of lines and said second plurality of lines are selectively interconnected through diodes by selectively annealing said regions.

15. A read only memory as defined by claim 14 wherein each of said regions is implanted with ions of one conductivity type adjacent to one of said first plurality of lines and is implanted with ions of opposite conductivity type adjacent to one of said second plurality of lines.

16. A semiconductor integrated circuit comprising a single crystalline silicon substrate, at least one active electrical component defined in said substrate by selective doping, an electrically insulating material provided on a major surface of said substrate, and a read only memory formed on said electrically insulative material, said read only memory including a first plurality of spaced parallel conductive lines on said insulative material, said first plurality of conductive lines including dopants of a first conductivity type, a layer of polycrystalline silicon material overlying said first plurality of conductive lines, said layer of polycrystalline silicon including doped regions extending at least partially through said layer, said doped regions including dopants of opposite conductivity type, each of said regions being positioned above one line of said first plurality of conductive lines, and a second plurality of spaced parallel conductive lines on the surface of said layer of polycrystalline silicon, said second plurality of conductive lines being skewed with respect to said first plurality of conductive lines with said doped regions provided at crossing points of said first plurality of lines and second plurality of lines.

17. A semiconductor integrated circuit as defined by claim 16 wherein said first plurality of lines and said second plurality of lines are selectively interconnected by applying a radiation beam to selected ones of said doped regions to thereby provide undirectional current paths between said first plurality of lines and said second plurality of lines.

18. A semiconductor integrated circuit as defined by claim 16 wherein said first plurality of conductive lines comprise doped polycrystalline silicon formed in a layer of polycrystalline silicon by selective doping and irradiation.

19. A semiconductor integrated circuit as defined by claim 18 wherein said second plurality of lines comprise metal.

20. A semiconductor integrated circuit as defined by claim 18 wherein said second plurality of lines comprise doped polycrystalline silicon.

21. A semiconductor integrated circuit as defined by claim 16 wherein said read only memory comprises a plurality of pairs of first and second conductive lines in a stacked array.

22. In a programmable read only memory having a first plurality of conductive lines and a second plurality of conductive lines overlaying said first plurality of conductive lines and a layer of polycrystalline semiconductive material therebetween, said layer of polycrystalline semiconductive material including doped regions extending at least partially through said layer, each of said regions being positioned between crossing points of said first plurality of lines and said second plurality of lines, the method of selectively interconnecting through diodes said first plurality of lines and said second plurality of lines including irradiating selected ones of said regions thereby diffusing dopant ions and providing unidirectional current paths between said first plurality of lines and said second plurality of lines.

23. The method defined by claim 22 wherein said first plurality of lines comprise polycrystalline silicon material of a first conductivity type, said doped regions being of opposite conductivity type, wherein said step of irradiating a region creates a P-N junction.

24. The method defined by claim 22 wherein said doped regions extend partially through said layer and wherein said step of irradiating a region diffuses dopants in said region to form a P-N junction between said region and one of said first plurality of lines.

25. The method defined by claim 22 wherein said doped regions are formed by ion implantation and extend substantially through said layer and wherein said step of irradiating a region anneals said region and activates ions therein.

* * * * *